US 12,108,539 B2

United States Patent
Yuen et al.

(10) Patent No.: US 12,108,539 B2
(45) Date of Patent: Oct. 1, 2024

(54) FOUR DIMENSIONAL PRINTED CIRCUIT BOARDS

(71) Applicant: The Government of the United States of America, as represented by the Secretary of the Navy, Arlington, VA (US)

(72) Inventors: Jonathan D. Yuen, Washington, DC (US); Joyce C. Breger, Greenbelt, MD (US); David A. Stenger, Annapolis, MD (US)

(73) Assignee: The Government of the United States of America, as represented by the Secretary of the Navy, Arlington, VA (US)

(*) Notice: Subject to any disclaimer, the term of this patent is extended or adjusted under 35 U.S.C. 154(b) by 414 days.

(21) Appl. No.: 17/738,122

(22) Filed: May 6, 2022

(65) Prior Publication Data
US 2022/0369470 A1 Nov. 17, 2022

Related U.S. Application Data (60) Provisional application No. 63/186,832, filed on May 11, 2021.

(51) Int. Cl.
| | | |
|---|---|---|
| C08L 1/02 | (2006.01) | |
| H05K 1/03 | (2006.01) | |
| H05K 1/11 | (2006.01) | |
| H05K 3/12 | (2006.01) | |
| H05K 3/18 | (2006.01) | |

(52) U.S. Cl.
CPC ........... *H05K 3/125* (2013.01); *C08L 1/02* (2013.01); *H05K 1/0393* (2013.01); *H05K 1/118* (2013.01); *H05K 3/181* (2013.01)

(58) Field of Classification Search
CPC ...... H05K 3/125; H05K 1/0393; H05K 1/118; H05K 3/181; C08L 1/02
USPC .......................................................... 174/254
See application file for complete search history.

(56) References Cited

U.S. PATENT DOCUMENTS 9,720,318 B2 * 8/2017 Daniele .................. C12P 19/04
10,774,227 B2 * 9/2020 Gatenholm ............ B33Y 70/00
(Continued)

OTHER PUBLICATIONS

Gladman et al., "Biomimetic 4D printing." Nature Mater 15, 413-418 (2016).
(Continued)

*Primary Examiner* — Timothy J Thompson
*Assistant Examiner* — Michael F McAllister
(74) *Attorney, Agent, or Firm* — US Naval Research Laboratory; Roy Roberts (57) ABSTRACT

Described herein are ultra-thin nanocellulose flexible electronic device on which SU-8, an epoxy material which can become highly stressed upon UV exposure, is printed on desired areas. Upon UV exposure and then release from the surface it is anchored on, the nanocellulose device will spontaneously self-mold into a desired form due to stress differences between the SU-8 and the nanocellulose sheet. The flexible electronics can be manufactured using standard printed circuit board processing techniques, including electroless metallization and soldering of surface mount components.

6 Claims, 6 Drawing Sheets

(56) References Cited

U.S. PATENT DOCUMENTS

| | | | |
|---|---|---|---|
| 2016/0198984 A1* | 7/2016 | Daniele | D21H 27/30 |
| | | | 427/121 |
| 2017/0153541 A1* | 6/2017 | Daniele | A61B 5/6813 |
| 2018/0112177 A1 | 4/2018 | Walper et al. | |
| 2018/0179348 A1* | 6/2018 | Retsina | C08L 1/04 |
| 2019/0275746 A1* | 9/2019 | Huang | B29C 64/112 |
| 2020/0102425 A1* | 4/2020 | Youngblood | C08L 1/02 |
| 2020/0315025 A1 | 10/2020 | Yuen et al. | |
| 2021/0146610 A1* | 5/2021 | He | B29C 64/268 |

OTHER PUBLICATIONS

Ge et al., "Active materials by four-dimension printing." Appl. Phys. Lett. 103, 131901 (2013).

Zarek et al., "3D Printing of Shape Memory Polymers for Flexible Electronic Devices." Adv. Mater., 28: 4449-4454 (2016).

Sundaram et al., "3D-Printed Self-Folding Electronics." ACS Appl. Mater. Interfaces 9, 37, 32290-32298 (2017).

Hayes et al., "Self-Folding Origami Microstrip Antennas," IEEE Transactions on Antennas and Propagation, vol. 62, No. 10, pp. 5416-5419, (2014).

Yuen et al., "Electrolyte-Sensing Transistor Decals Enabled by Ultrathin Microbial Nanocellulose" Scientific Reports vol. 7, Article No. 40867 (2017).

* cited by examiner

FOUR DIMENSIONAL PRINTED CIRCUIT BOARDS

CROSS-REFERENCE TO RELATED APPLICATIONS

This application claims the benefit of U.S. Provisional Patent Application No. 63/186,832 filed on May 11, 2021, the entirety of which is incorporated herein by reference, and is related to U.S. Pat. No. 9,720,318 and U.S. Patent Application Publication Nos. 2016/0198984, 2018/0112177, and 2020/0315025.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing NC 111714.

BACKGROUND

Four-dimensional (4D) printing is an extension of three-dimensional (3D) printing (also termed additive manufacturing) where the fourth dimension refers to a change in form of the printed object caused by either time elapsed or environmental stimuli (such as heat and humidity). Existing techniques for 4D printing have the disadvantages such as energy needs to induce the change in form and requirements for specialized materials. See, for example, Ge et al., Appl. Phys. Lett. 103, 131901 (2013) and Gladman et al., Nature Mater 15, 413-418 (2016). Moreover, many of the materials used for 4D printing are not disposed to survive a printed circuit board (PCB) manufacturing process.

A need exists for improved techniques to manufacture 4D printed objects, particularly printed circuit boards (PCBs).

BRIEF SUMMARY

Described herein are flexible printed circuit boards (PCBs) which are printed as sheets, i.e. in two dimensions (2D), but when released can self-assemble or self-fold into three dimensional objects (3D). This can be achieved by printing a stressing layer (for example, a layer of SU-8 epoxy) on a nanocellulose PCB affixed on rigid surface, and then inducing a strain between the stressing layer and nanocellulose by ultraviolet (UV) exposure of the stressing layer. When the PCB is selectively cut and then released, the strain difference causes the PCB to flex and fold into a 3D shape.

In one embodiment, a four-dimensional (4D) printed circuit board (PCB) includes a nanocellulose sheet; an electrical circuit attached to the sheet; and a pattern of cured SU-8 on the sheet, wherein stress induced by the cured SU-8 is sufficient to cause folding of the nanocellulose sheet.

In another embodiment, a method of making a four-dimensional (4D) printed circuit board, includes printing a palladium ink pattern onto a nanocellulose sheet; performing electroless plating of copper onto the pattern; printing a stressing layer of SU-8 onto the nanocellulose sheet; and exposing the SU-8 to ultraviolet light to cure the SU-8, wherein stress induced by the cured SU-8 is sufficient to cause folding of the nanocellulose sheet.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used herein, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

As used herein, the term SU-8 refers to a composition comprising a novolak epoxy with an average epoxide group functionality of about eight. Typically, the epoxy resin is provided in an organic solvent.

Overview

Described herein are ultra-thin nanocellulose flexible electronic device on which SU-8, an epoxy material which can become highly stressed upon UV exposure, is printed on desired areas. Upon UV exposure and then release from the surface it is anchored on, the nanocellulose device will spontaneously self-mold into a desired form due to stress differences between the SU-8 and the nanocellulose sheet. The flexible electronics can be manufactured using standard printed circuit board processing techniques, including electroless metallization and soldering of surface mount components.

The techniques described herein differ from previously-described technologies in a few aspects. First, rather than the continuously dynamic forms found in the prior art, the present goal is an essentially irreversible change of form post-fabrication, so that the final form of the PCB is not easily changed—in various embodiments, reversing the change into the final form may result in at least partial destruction of the PCB and/or may require external mechanical force. Second, the electronics are not configured in order to enable the change in form, rather, they are designed for the application at hand. And third, the change in form happens independently from the operation of the electronics, and power is not applied towards changing the form. These differences result in different applications: whereas the reversible shape-morphing systems are geared towards dynamic technologies such as robotics, the present technology is geared towards static systems such as 3D antennas, medical equipment, energy storage, and biomanufacturing.

One important feature is the use of sheets sufficiently thin and with mechanical properties such that the stress emanating from a thin layer of SU-8 can induce folding, yet the sheet is self-supporting. For this, microbial nanocellulose sheets are used. Microbial nanocellulose sheets have been developed with a thickness of less than 20 μm for this purpose. See commonly-owned U.S. Patent Application Publication No. 2016/0198984. This nanocellulose is highly chemical and solvent resistant, mechanically strong, water permeable, and biocompatible, and can be attached to a variety of surfaces and substrates. These sheets can be easily de-laminated from the substrate simply by moistening the film, resulting in a freestanding microns-thick film. Additionally, a variety of materials can also be deposited either within or onto these nanocellulose sheets using standard printing processes, such as inkjet printing. By inkjet printing a palladium catalyst ink onto these sheet, one can then immerse the sheet into an electroless copper plating bath, allowing the printed regions on the sheet to be spontaneously plated with copper both within and on the sheet. A soldering process to attach surface-mount electronic devices, such as light emitting diodes (LEDs), onto the copper-plated patterns on the sheet is disclosed in commonly-owned U.S. Patent Application Publication No. 2020/0315025.

Examples

Figure 1:
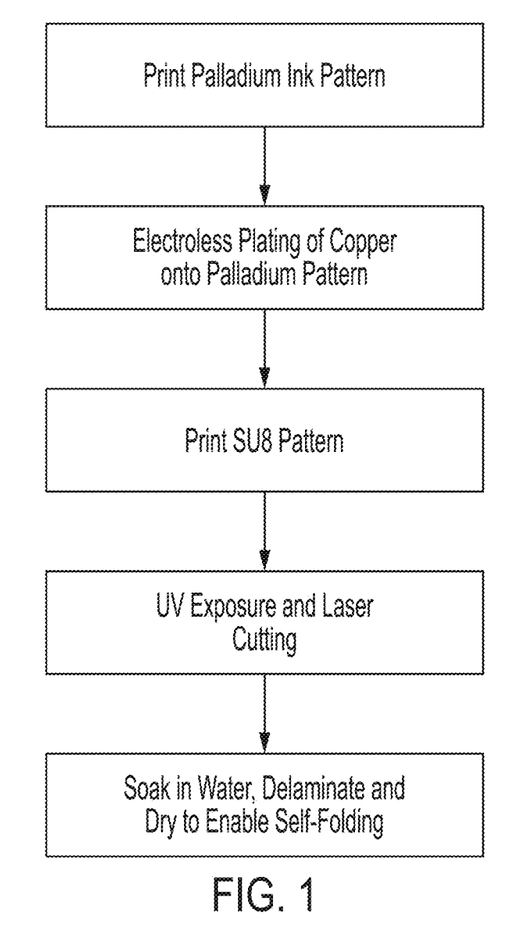
FIG. 1 shows the process flow in which the 4D printed circuit boards are fabricated.
Figure 2:
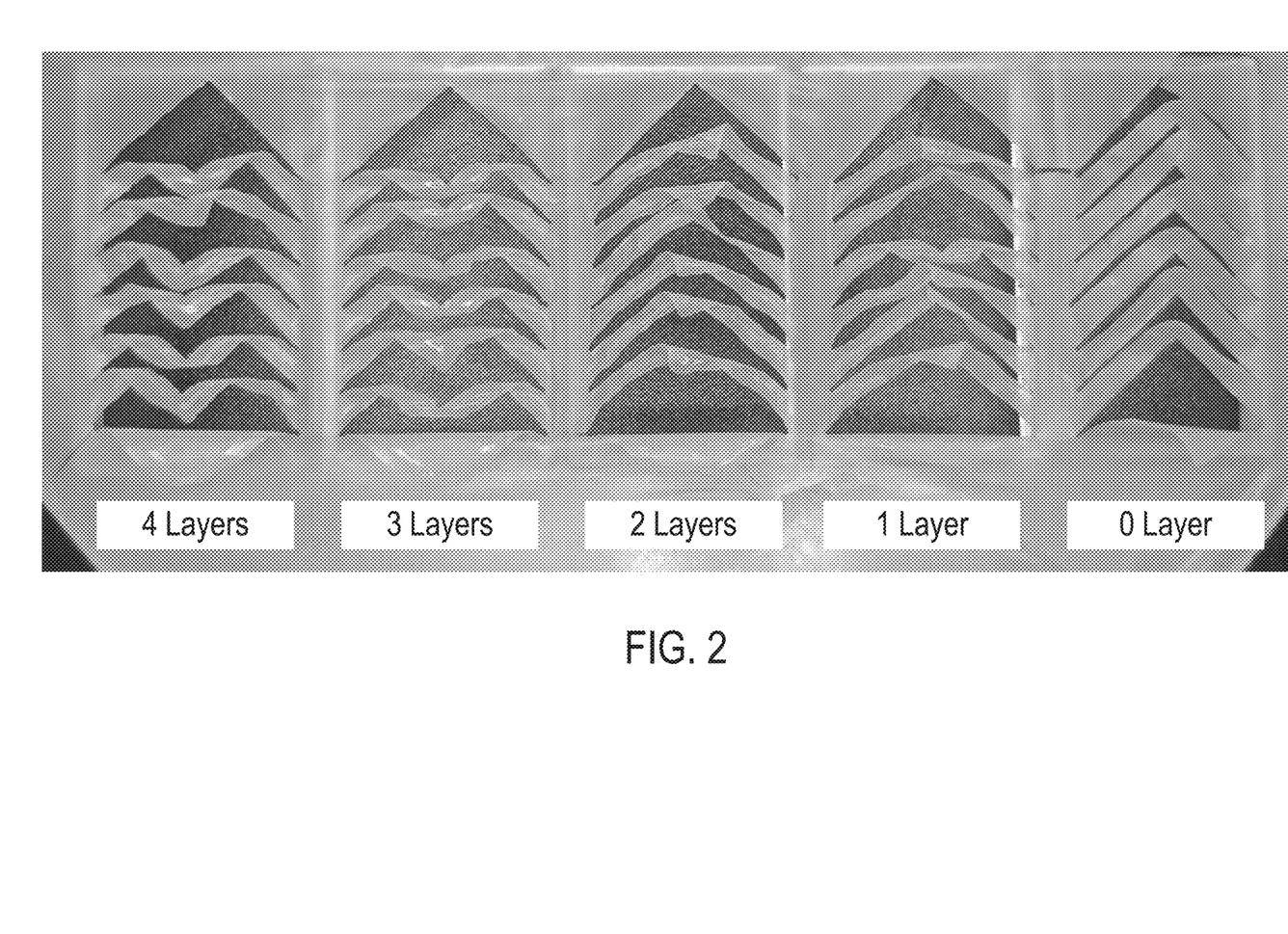
FIG. 2 shows the effect of the variation of thickness of the SU-8 layer on the nanocellulose with degrees of curvature of the sheet.

FIG. 1 presents a schematic flowchart of the fabrication of an exemplary 4D printed electronic device. One begins with the plating of the metallic wiring component of the printed circuit board. First, inkjet printing was used to deposit a desired circuit pattern in palladium catalyst ink onto a blank nanocellulose sheet laminated on a glass wafer. Second, the printed nanocellulose sheet was immersed into a copper plating bath to electrolessly plate copper onto the tracing, resulting in a metallic wiring diagram. The next step was the deposition of the SU-8 strain layer, which starts with inkjet printing of a pattern in SU-8 and subsequent exposure to UV to induce strain. A cut pattern was then defined on the sheet using a laser cutter to release selected parts of the sheet for folding. Finally, the sheet is soaked and peeled off the glass wafer and re-laminated onto an acrylate board with holes cut where the cut patterns are defined to allow space for folding to occur. The folding occurs as the nanocellulose sheet dries. FIG. 2 shows the effect of the SU-8 thickness on the degree of folding on the nanocellulose: folding occurs once a certain thickness has achieved, in this case when a third layer of SU-8 has been placed. This indicates that folding occurs when the internal stresses of the SU-8 layer exceeds that of the underlying nanocellulose sheet. This can be achieved not only by changing the thickness of SU-8, but also by modification of other properties of either the SU-8 and/or the nanocellulose. Such properties include degree of crosslinking in the SU-8, different materials other than SU-8 and inclusion of fillers either in SU-8 or nanocellulose.

Figure 3:
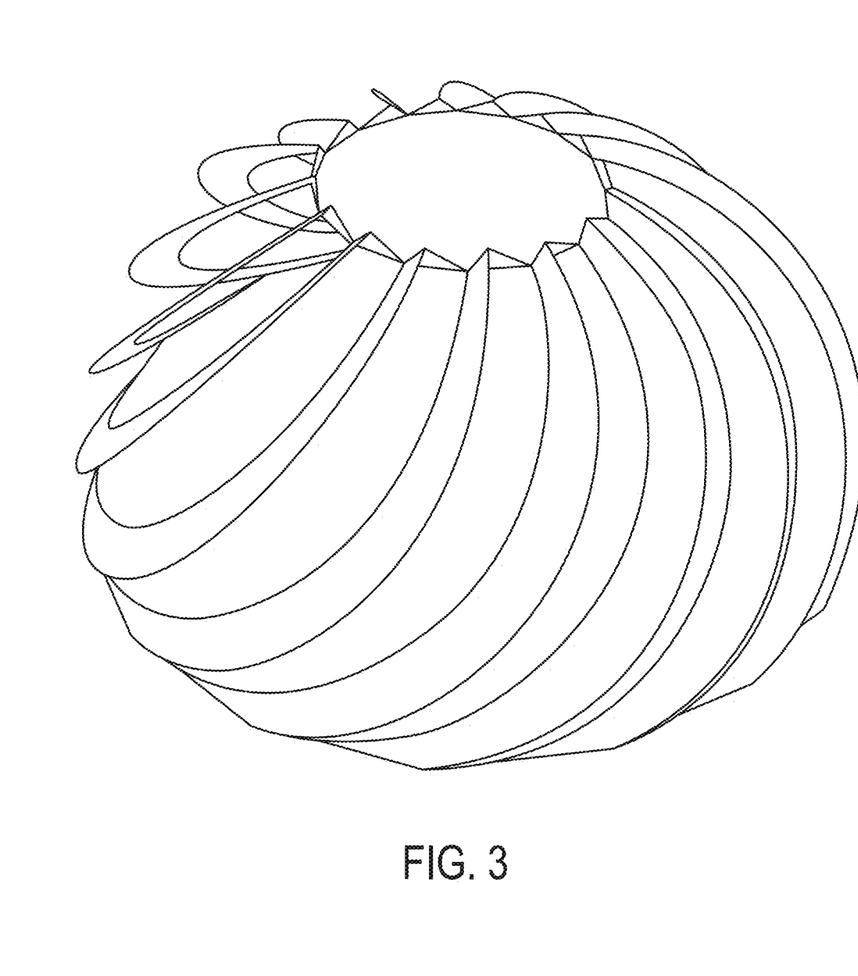
FIG. 3 shows the model on which the 4D kirigami PCB is based on, as designed by Professor Yoshinobu Miyamoto.
Figure 4:
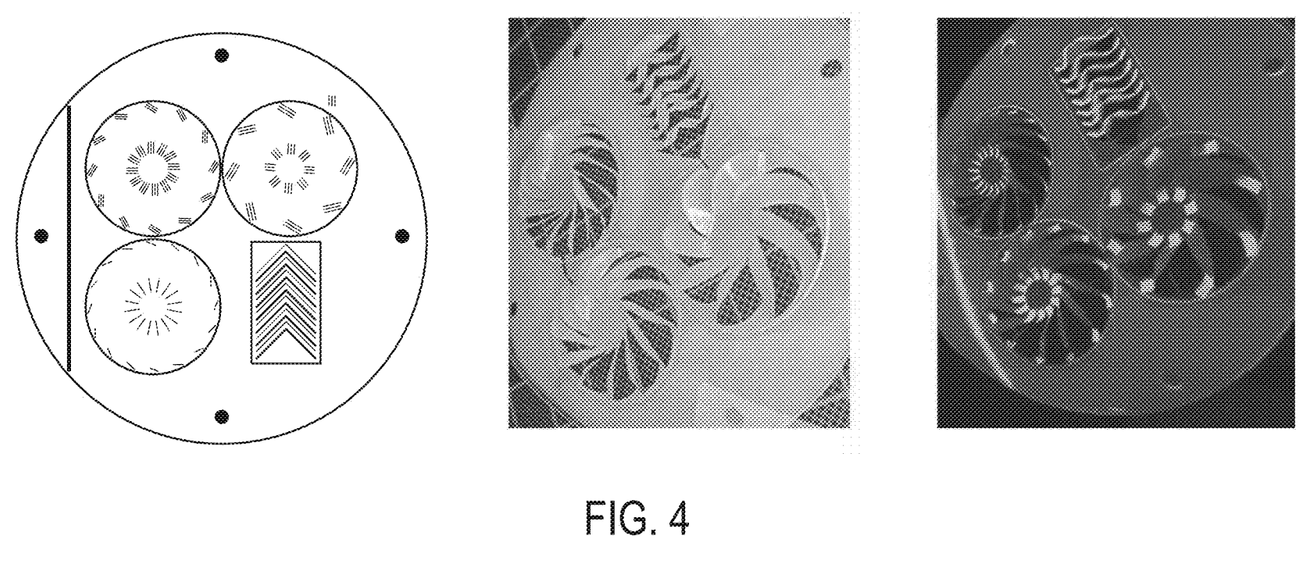
FIG. 4 shows the pattern in FIG. 3 replicated as a self-folding form using our nanocellulose sheet printed with SU-8, under normal light (middle) and UV light (right). A tracing of the initial pattern containing both lines for printing and cutting is shown on the left.
Figure 5:
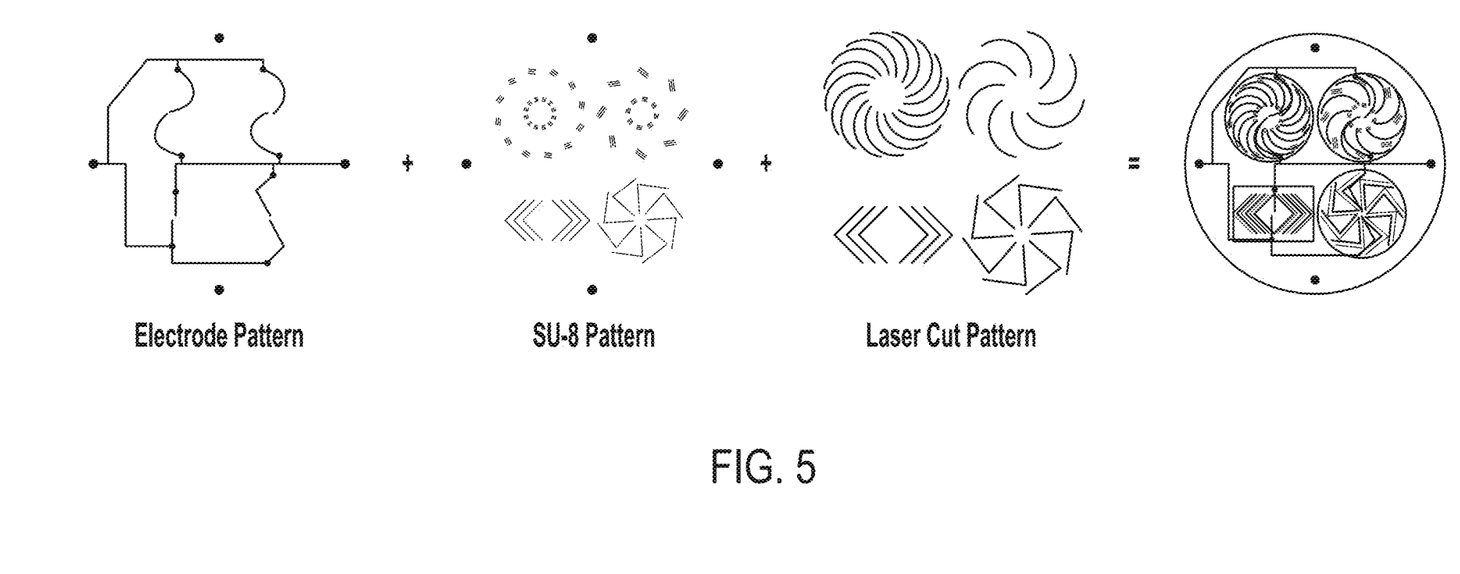
FIG. 5 is a figurative descriptions of all the individual layers that form the 4D kirigami PCB.
Figure 6:
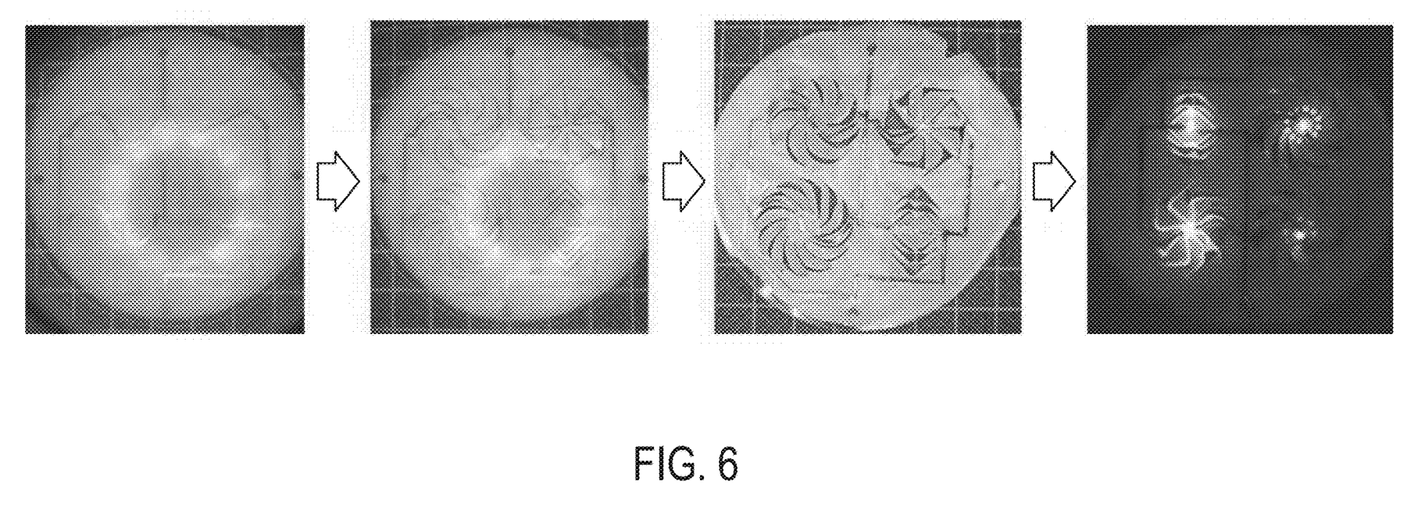
FIG. 6 shows the sequential process in which the 4D kirigami PCB is formed, from printing of the metallic wire tracings to the operation of the device.

To realize exemplary 3D forms, kirigami designs were implemented using this 4D PCB technology. Kirigami is a Japanese paper craft which involves the selective cutting and folding of paper to form 3D shapes. FIG. 3 shows a form created by the architect-professor Yoshinobu Miyamoto which was used as the design basis for a 4D printed circuit board. FIG. 4 shows the implementation of that design using selectively printed SU-8 layers, which we were impregnated with a fluorescent dye such that they can be revealed under UV illumination. Good fidelity with the original form created by Prof. Miyamoto is observed. Finally, both metallic wire tracings and surface mount UV LEDs were integrated into the self-folding kirigami 3D form to create an operational 4D printed circuit board, as shown in both in a layer-by-layer figurative layout in FIG. 5 and the fabrication sequence in FIG. 6. The bottom-most image in FIG. 6 shows the operation of the 4D PCB: as the UV LEDs were powered to emit UV radiation, they in turn induced the nearby SU-8 layers to fluoresce

Further Embodiments

Alternative materials might be substituted for those used in the examples. For example, the microns-thin foils on which the flexible electronics are built could be replaced by a free-standing thin film below 10 μm thickness. Likewise, other suitable materials can be considered, including metal, polymer, monomer, ceramic and glass, for use as stressing layers and substrates. For metal layers, other metals can be considered such as gold, aluminum, nickel, silver and chromium. For the electronics, other forms of electronic devices can be considered, including free standing dies, foils, and deposited films.

Alternative methods can also be considered in place of those used in the examples. Alternative deposition methods for both metal and stressing layer can be considered, and are not limited to, screen-printing, lithography, gravure, roll-to-roll, spray-printing, batik, laser, flexography, thermal-printing, stamping, intaglio, lamination, adhesion, shadow-mask evaporation, sputtering, electron/ion-beam evaporation, pulsed-laser deposition. Alternative methods for attaching electronics can be considered, such as replacing solder with conductive epoxy, ball bonding, and adhesives. Alternative methods for cutting forms can be considered, including shearing, die cutting, waterjet cutting, computer-controlled plotter cutting, and abrasion cutting.

Advantages

The technique described herein confers a number of advantages.

One significant feature is the ability to achieve mass production of complex self-folding forms with electronic capability in the macroscale. While complex self-folding forms exist, they are typically on substrates that are difficult to fabricate electronics on, such as hydrogels.

A further advantage is that no need exists for prior modification of the substrate, or use of special materials. In most systems, the substrates has be pre-stressed, prestretched, infused with liquid to allow for swelling, or have to be built upon specialized materials such as shape memory polymers or metal alloys.

Nanocellulose provides specific advantages, one of which is that it is highly amenable to simple solution processing methods, of which PCB technology extensively uses. This promises a low-cost, high-throughput fabrication for these 4D PCBs. Compared to other technologies, the present use UV exposure to initiate self-folding makes the system insensitive to heat, light, and moisture, and thus more amenable to standard PCB fabrication processes.

The ability to direct UV light on demand provides temporal and spatial control of the self-folding process—once can activate the self-folding at selected locations on the substrate a desired time. This enables sequential actuation of folding elements on PCB and the ability to actuate one or more folding features without actuating others on the same PCB.

Furthermore, this technology can provide logistic benefits, in that a print compact and easily packaged flat form can be delivered for later induction into a 3D form when desired.

Concluding Remarks

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

What is claimed is:

1. A four-dimensional (4D) printed circuit board (PCB), comprising:
    a nanocellulose sheet;
    an electrical circuit attached to the sheet; and
    a pattern of cured SU-8 on the sheet, wherein stress induced by the cured SU-8 is sufficient to cause folding of the nanocellulose sheet.

2. The 4D PCB of claim 1, wherein the nanocellulose sheet is no thicker than 10 µm.

3. The 4D PCB of claim 1, wherein the electrical circuit comprises conductors in a state of having been produced by electroless plating.

4. A method of making a four-dimensional (4D) printed circuit board, comprising:
    printing a palladium ink pattern onto a nanocellulose sheet;
    performing electroless plating of copper onto the pattern;
    printing a stressing layer of SU-8 onto the nanocellulose sheet; and
    exposing the SU-8 to ultraviolet light to cure the SU-8, wherein stress induced by the cured SU-8 is sufficient to cause folding of the nanocellulose sheet.

5. The method of claim 4, further comprising soaking the nanocellulose sheet in water to delaminate it from a substrate, and drying the delaminated nanocellulose sheet.

6. The method of claim 4, further comprising laser cutting the nanocellulose sheet.

* * * * *